United States Patent [19]

Yoneda

[11] Patent Number: 5,432,737
[45] Date of Patent: Jul. 11, 1995

[54] SEMICONDUCTOR MEMORY
[75] Inventor: Masato Yoneda, Tokyo, Japan
[73] Assignee: Kawasaki Steel Corporation, Tokyo, Japan
[21] Appl. No.: 315,862
[22] Filed: Sep. 30, 1994

Related U.S. Application Data

[62] Division of Ser. No. 991,463, Dec. 16, 1992, Pat. No. 5,406,514.

[30] Foreign Application Priority Data

Dec. 21, 1991 [JP] Japan .................. 3-339124
Dec. 24, 1991 [JP] Japan .................. 3-339212
Feb. 25, 1992 [JP] Japan .................. 4-37865

[51] Int. Cl.$^6$ .................. G11C 11/34
[52] U.S. Cl. .................. 365/182; 365/185; 365/218
[58] Field of Search .......... 365/182, 185, 900, 218, 365/226; 257/315, 316, 317

[56] References Cited

U.S. PATENT DOCUMENTS 5,021,847 6/1991 Eitan et al. .
5,274,588 12/1993 Manzur et al. .................. 365/182 X

OTHER PUBLICATIONS

Takaai Nozaki et al.—A 1 Mb EEPROM with MONOS Memory Cell for Semiconductor Disk Application, IEEE Journal Solid-state Circuits, vol. 26, No. 4, Apr. 1991.

Primary Examiner—Joseph A. Popek
Assistant Examiner—Huan Hoang
Attorney, Agent, or Firm—Oliff & Berridge

[57] ABSTRACT

In a semiconductor memory comprising first bit lines, second bit lines and first nonvolatile split gate memory cells and second nonvolatile split gate memory cells respectively having common source electrodes, memory gate electrodes connected to common memory gate lines, and drain electrodes connected, respectively, to the first bit lines and the second bit lines, a source voltage applying means applies a voltage VS different from a voltage applied to the substrate and meeting a relation represented by:

$$min(VB1, VB2) < VS < max(VB1, VB2)$$

where VB1 is a voltage of the first bit line, VB2 is a voltage applied to the second bit line, min(VB1, VB2) is the lower one of the voltages VB1 and VB2, and max(VB1, VB2) is the higher one of the voltages VB1 and VB2, to the source electrode in writing data on the first nonvolatile split gate memory cell.

1 Claim, 12 Drawing Sheets

SEMICONDUCTOR MEMORY

This is a division of application No. 07/991,463 filed Dec. 16, 1992, now U.S. Pat. No. 5,406,514.

BACKGROUND OF THE INVENTION

1. Field of the Invention

The present invention relates to a semiconductor memory having electrically erasable, nonvolatile split gate memory cells generally called MNOS memory cells or MONOS memory cells.

2. Description of the Related Art

An electrically erasable, nonvolatile split gate memory cell generally called a MNOS memory cell or a MONOS memory cell has two gate electrodes, i.e., an address gate electrode and a memory gate electrode. A voltage to be applied to the memory gate to turn on the integral transistor of the memory cell, i.e., a threshold voltage, changes depending on whether electrons are injected (write) into a predetermined layer of the memory gate or electrons are emitted (erase) from the predetermined layer. A digital value "0" is stored in the memory cell for writing or a digital value "1" is stored in the memory cell for erasing. In read operation, it is recognized whether the memory cell has been written or in erased, namely, whether the contents of the memory cell is "0" or "1", through the detection of the threshold voltage.

FIG. 6 is a circuit diagram of a portion of a semiconductor memory employing such nonvolatile split gate memory cells and FIG. 7 is a plan view of a semiconductor chip, showing the portion of the semiconductor memory shown in FIG. 6. In FIGS. 6 and 7, like or corresponding parts are denoted by the same reference characters.

Shown in FIGS. 6 and 7 are four memory cells 10, 20, 30 and 40. The respective drain electrodes 11 and 31 of the memory cells 10 and 30 are connected to a bit line Bi, namely, a vertical line, and the respective drain electrodes 21 and 41 of the memory cells 20 and 40 are connected to a bit line Bi+1. The respective source electrodes 12, 22, 32 and 42 of the memory cells 10, 20, 30 and 20 are grounded. The respective address gate electrodes 13 and 23 of the memory cells 10 and 20 are connected to an address gate line X1, and the respective memory gate electrodes 14 and 24 of the memory cells 10 and 20 are connected to a memory gate line W1. Similarly, the respective address gate electrodes 33 and 43 of the memory cells 30 and 40 are connected to an address gate line X2 and the respective memory gate electrodes of the memory cells 30 and 40 are connected to a memory gate line W2.

When writing data on the memory cell 10 of the semiconductor memory, a voltage of, for example, 0 V is applied to the memory gate line W1, and the bit line Bi and the substrate are grounded. When erasing the memory cell 10, the memory gate line W1 is grounded and a voltage of 9 V is applied to the bit line Bi. When reading the contents of 1 the memory cell 10, a predetermined positive voltage is applied to the address gate line X1, and the bit line Bi is connected to a current sense amplifier, not shown, to decide whether the contents of the memory cell 10 is "0" or "1" by detecting whether any current flows from the drain electrode 11 of the memory cell 10 to the source electrode 12 of the same (ON state) or whether no current flows from the drain electrode 11 to the source electrode 12 (OFF state).

The number of repetition of rewrite operation, i.e., erase and write operation, possible with the nonvolatile split gate memory cell, such as a MONOS memory cell, is on the order of $10^7$, which is about 100 times the number of repetition of rewrite operation with a stacked gate memory cell having two superposed gates.

Although the possibility of repeating rewrite operation such a large number of times is a significant advantage of the nonvolatile split gate memory cell, the area of the nonvolatile split gate memory cell is greater than that of the stacked gate memory cell and hence the degree of integration of a semiconductor memory comprising nonvolatile split gate memory cells is reduced accordingly, and the size of a chip carrying a semiconductor memory comprising nonvolatile split gate memory cells is greater than that of a chip carrying a semiconductor memory comprising stacked gate memory cells and having a storage capacity equal to the former semiconductor memory, because the address gate electrode and the memory gate electrode of the nonvolatile split gate memory cell are arranged side by side in a plane and the area of each memory cell enclosed by alternate long and short dash lines in FIG. 7 is about 17.2 $\mu$m2 if the configuration shown in FIG. 7 is designed on the basis of a design rule of, for example, 1 $\mu$m, which is greater than the area of a stacked gate memory cell designed on the basis of the same design rule by about 20%.

Memory cells of a known semiconductor memory of an X-configuration, such as a ROM of an X-configuration, are arranged in a layout capable of increasing the degree of integration.

FIG. 8 is a circuit diagram showing a portion of such a ROM of an X-configuration.

Three bit lines Bi−1, Bi and Bi+1 among a plurality of bit lines, and four memory cells 110, 120, 130 and 140 disposed between the adjacent bit lines among a plurality of memory cells are shown in FIG. 8, in which the bit lines are extended vertically. The memory cells 110 and 120 are arranged on a memory cell line extending between the upper left-hand point and a lower right-hand point, and the memory cells 120 and 130 arranged on a memory cell line extending between an upper right-hand point and a lower left-hand point.

The memory cells 110, 120, 130 and 140 have two source/drain electrodes 111 and 112, two source/drain electrodes 121 and 122, two source/drain electrodes 131 and 132, and two source/drain electrodes 141 and 142, respectively. The source/drain electrodes 112, 122, 131 and 141 are connected to a predetermined point 160 on the bit line Bi. The respective source/drain electrodes 111 and 132 of the memory cells 110 and 130 are connected to predetermined points on the bit line Bi−1, respectively. The respective source/drain electrodes 121 and 142 of the memory cells 120 and 140 are connected to predetermined points on the bit line Bi+1, respectively. The respective gate electrodes 113 and 123 of the memory cells 110 and 120 are connected to a gate line W1 horizontally extending in FIG. 8, and the respective gate electrodes 133 and 143 of the memory cells 130 and 140 are connected to a gate line W2.

In the ROM, "1" is stored in, for example, the memory cell 110 when a line 115 connecting the memory cell 110 to the bit line Bi−1 is equivalently broken or "0" is stored in the memory cell 110 when the line 115 is not equivalently broken. For example, in reading information stored in the memory cell 110, "1" is read from the memory cell 110 if no current flows through the memory cell 110 when the bit line Bi−1 is grounded, the bit line Bi is connected to a current sense amplifier and a predetermined positive voltage is applied to the gate line W1. For example, in reading information stored in the memory cell 120, "0" is read from the memory cell 120 if a current flows through the memory cell 120 when the bit line Bi is grounded, the bit line Bi+1 is connected to a current sense amplifier and a predetermined positive voltage is applied to the gate line W1.

In forming a ROM having memory cells each having a single gate, the memory cells can be arranged in a high density on a semiconductor chip to increase the degree of integration by arranging the memory cells in an X-configuration. However, it is difficult to arrange split gate memory cells in an X-configuration because of the following reasons.

FIG. 9 is a circuit diagram of a portion of a semiconductor memory comprising split gate memory cells arranged in an X-configuration, in which three bit lines Bi−1, Bi and Bi+1 among a plurality of bit lines, and four memory cells 210, 220, 230 and 240 among a plurality of memory cells are shown. The memory cells 210, 220, 230 and 240 are disposed between the adjacent bit line, the memory cells 210 and 240 are arranged on a memory cell line extending between an upper left-hand point and a lower right-hand point, and the memory cells 220 and 230 are arranged on a memory cell line extending between an upper right-hand point and a lower left-hand point.

The memory cells 210, 220, 230 and 240 have two source/drain electrodes 211 and 212, two source/drain electrodes 221 and 222, two source/drain electrodes 231 and 232, and two source/drain electrodes 241 and 242, respectively. The source/drain electrodes 212, 222, 231 and 241 are connected to a predetermined point 260 on the bit line Bi. The respective source/drain electrodes 211 and 232 of the memory cells 210 and 230 are connected, respectively, to predetermined points on the bit line Bi−1, the respective source/drain electrodes 221 and 242 of the memory cells 220 and 240 are connected, respectively, to predetermined points on the bit line Bi+1. The respective address gate electrodes 213 and 223 of the memory cells 210 and 220 are connected to an address gate line X1, the respective memory gate electrodes 214 and 224 of the memory cells 210 and 220 are connected to a memory gate line W1, the respective address gate electrodes 233 and 243 of the memory cells 230 and 220 are connected to an address gate line X2, and the respective memory gate electrodes 234 and 244 of the memory cells 230 and 340 are connected to a memory gate line W2.

In writing data on, for example, the memory cell 230, a voltage of, for example, 9 V is applied to the memory gate line W2 and the bit line Bi is grounded to inject electrons (write) into the memory gate electrode 234 of the memory cell 230. Since the respective memory gate electrodes 234 and 244 of the memory cells 230 and 240 are connected to the memory gate line W2, the voltage of 9 V is applied simultaneously to both the memory gate electrodes 232 and 244. Since the respective source/drain electrodes 231 and 241 of the memory cells 230 and 240 are connected to the bit line Bi, both the source/drain electrode 231 of the memory cell 230 and the source/drain electrode 241 of the memory cell 240 goes 0 V when the bit line Bi is grounded and, consequently, the data is written on both the memory cells 230 and 240. Thus, the respective states (write state and erase state) of the two memory cells 230 and 240 cannot be individually controlled.

The degree of integration is dependent on the size of the memory cells as well as on the layout of the memory cells. The effect of reduction in size of memory cells will be described hereinafter.

FIG. 10 is a circuit diagram of a portion of a semiconductor memory comprising the foregoing nonvolatile split gate memory cells (Takaaki Nozaki, et al., "A 1 Mb EEPROM with MONOS Memory Cell for Semiconductor Disk Application", IEEE Journal of Solid-state Circuits, Vol. 26, No. 4, April 1991).

In FIG. 10, four memory cells 410, 420, 430 and 440 among a plurality of memory cells. The respective address gate electrodes 411 and 421 of the memory cells 410 and 420 are connected to an address gate line X11, the respective memory gate electrodes 412 and 422 of the memory cells 410 and 420 are connected to a memory gate line W11, the respective drain electrodes 413 and 423 of the memory cells 40 and 420 are connected, respectively, to bit lines B11 and B21, and the memory cells 410 and 420 have a common source electrode 402. The source electrode 402 is connected electrically to a substrate 401 as represented by a line CS/PW. The memory cells 430 and 440 are similar in construction to the memory cells 410 and 420. The respective address gate electrodes 431 and 441 of the memory cells 430 and 440 are connected to an address gate line X21, the memory gate electrodes 432 and 442 of the memory cells 430 and 440 are connected to a memory gate line W21, and the respective drain electrodes 433 and 434 of the memory cells 430 and 440 are connected, respectively, to bit lines B11 and B21. The memory cells 430 and 440 have a common source electrode 403 connected to the line CS/PW.

When writing data on, erasing data stored in or reading data from the memory cell 410, voltages tabulated in Table 1 are applied to the lines X11, X21, W11, W21, B11, B21 and CS/PW.

TABLE 1

| | Lines | | | | | | |
|---|---|---|---|---|---|---|---|
| | X11 | X21 | W11 | W2 | B11 | B21 | CS/PW |
| Write mode | −4 | −4 | 5 | −4 | −4 | 5 | −4 |
| Erase mode | −4 | −4 | −4 | −4 | 5 | 5 | 5 |
| Read mode | 5 | 0 | 0 | 0 | Sense amp. | Open | 0 |

The operation of the prior art semiconductor memory in the write mode, in which problems reside, will be described hereinafter.

In the write mode, the memory gate line W11 is at 5 V and the bit line B11 is at −4 V. Therefore, the voltage across the memory electrode 412 of the memory cell 410 and a layer 412' facing the memory electrode 412 is 9 V, and electrons ape injected from the substrate 401 into the memory gate electrode 412 for writing; in the meantime a voltage of 5 V is applied to the memory gate electrode 422 of the memory cell 420, and a voltage of −4 V is applied to a layer 422' facing the memory gate electrode 422 if the memory cell 420 has been written, or a voltage of 5 V is applied to the layer 422' if the memory cell 420 has been erased. If the memory cell 420 has been written, the voltage applied across the memory gate electrode 422 and the layer 422'9 V and data is written again on the memory cell 420. Since the memory cell 420 has been written, no problem arises in writing data in the memory cell 420. If the memory cell 420 has been erased, the voltage across the memory gate electrode 422 and the layer 422' is 0 V, and neither writing nor erasing is performed. Similarly, not problems arises in writing data on or erasing data written on the memory cells 430 and 440.

There is no problem in writing data on or erasing data written on the memory cell 420 in the write mode. However, a voltage of 9 V is applied across the drain electrode 423 (5 V) and the source electrode 402 (−4 V).

Recently, the degree of integration of integrated circuits has been progressively increased and the microminiaturization of integrated circuits has been progressively advanced. For example, the application of design rules of 0.8 $\mu$m and 0.5 $\mu$m to designing integrated circuits has been tried.

In writing data in memory cells, a voltage on the order of 9 V must be applied across the memory cells regardless of the size of the memory cells. The withstand voltage across the drain and source of the memory cell decreases with the miniaturization of the memory cell, and a design rule of 1.0 $\mu$m is substantially the smallest possible design rule. If a voltage higher than the withstand voltage is applied across the drain and source of the memory cell, punch-through occurs and a current flows through the source and the drain regardless the gate voltage. Thus, the reduction in the withstand voltage across the drain and source of the memory cell is a barrier to the miniaturization of the memory cell. References will be made to the life of MNOS memory cells and MONOS memory cells.

FIG. 11 is a graph showing the dependence of threshold voltages for a MNOS memory cell and a MONOS memory cell on write time and erase time. If the write time and the erase time is 1 msec, the threshold voltage for writing is about +2 V and the threshold voltage for erasing is about −2 V.

When reading data from the memory cell, the difference (memory window) between the threshold voltage for a write state (referred to as "state 0") where electrons are injected into the memory cell and the threshold voltage for an erase state (referred to as "state 1") where electrons are extracted from the memory cell is determined to discriminate between the state 0 and the state 1; that is, for example, if a voltage of, for example, 0 V corresponding to the middle voltage between the threshold voltage of, for example, 2 V for the state 0 and that of, for example, −2 V for the state 1 is applied to the gate, the potential 0 V of the gate is lower than the threshold voltage +2 V for the state 0 in the state 0 and the memory cell is in an OFF state, and the gate voltage 0 V is higher than the threshold voltage −2 V for the state 1 in the state 1 and the memory cell is in an ON state. Thus, the contents of the memory cell, i.e., "0" or "1" is detected through the detection of the potential of the read line or the current flowing through the read line.

The threshold voltages for the memory cells change with time and the mode of change of the threshold voltages is dependent on the number of times of repetition of writing and erasing.

FIG. 12 is a graph showing the charge holding characteristics of a MNOS memory cell after predetermined numbers of write-erase cycles, namely, one write-erase cycle, 105 write-erase cycles, 106 write-erase cycles and 107 write-erase cycles. As is obvious from FIG. 12, the threshold voltage for writing decreases with time while the threshold voltage for erasing increases with time, so that the difference between the threshold voltage for writing and that for the erasing decreases. The respective modes of the threshold voltage for writing and the threshold voltage for erasing are dependent on the numbers of repetition of write cycles and erase cycles.

When the threshold voltage for writing or erasing is in a discrimination unable range shown in FIG. 11, it is impossible to discriminate between the state 0 and the state 1. Accordingly, time in which the threshold voltage for the writing decreases or the threshold voltage for erasing increases to a voltage within the discrimination unable range is the life of the memory cell. The discrimination unable range is dependent principally on the circuit configuration of the read system. For example, in the case of the memory cell having the threshold voltage characteristics shown in FIG. 11, if rewrite cycle is repeated 107 times, the threshold voltage for erasing increases to a voltage within the discrimination unable range in about 106 sec (about eleven days), which is the life of the memory cell. The change of the threshold voltage of the MONOS memory cell is similar to that of the threshold voltage of the MNOS memory cell. For example, the life of the MONOS memory cell is about ten years when rewrite cycle is repeated 107 times.

It is one of the important problems with erasable nonvolatile memory cells, such as MNOS memory cells and MONOS memory cells, to increase the number of possible rewrite cycles without shortening the life.

SUMMARY OF THE INVENTION

It is a first object of the present invention to provide a semiconductor memory of a degree of integration higher than that of the conventional semiconductor memory, comprising electrically erasable split gate memory cells through the improvement of the layout of the electrically erasable split gate memory cells.

A second object of the present invention is to provide a semiconductor memory protected from breakdown due to punch-through even if the component memory cells thereof are miniaturized to increase the degree of integration and the source-drain withstand voltage of the memory cells is lower than a voltage necessary for writing.

A third object of the present invention is to provide a semiconductor memory comprising memory cells having an increased number of possible rewrite cycles and having an increased life.

A semiconductor memory in a first aspect of the present invention comprises: a plurality of electrically erasable, nonvolatile split gate memory cells each having two source/drain electrodes, and an address gate electrode and a memory gate electrode for controlling the two source/drain electrodes; and a plurality of parallel, vertical bit lines; wherein (a) the nonvolatile split gate memory cells are disposed between the adjacent bit lines, one of the two source/drain electrodes of each of the adjacent nonvolatile split gate memory cells on the opposite sides of each bit line is connected to a predetermined point on the same bit line so as to form a plurality of parallel first memory cell lines extending in parallel to a line extending in a first diagonal direction, (b) one of the two source/drain electrodes of each of the adjacent nonvolatile split gate memory cells on the opposite sides of each bit line is connected to a predetermined point on the same bit line so as to form a plurality of parallel second memory cell lines extending in parallel to a line extending in a second diagonal direction, and (c) the address gate electrode of one of the two nonvolatile split gate memory cells arranged horizontally on the opposite sides of each bit line, respectively, is nearer to the same bit line than the memory gate electrode of the same nonvolatile split gate memory cell, and the memory gate electrode of the other nonvolatile split gate memory cell is nearer to the same bit line than the address gate electrode of the same nonvolatile split gate memory cell.

The semiconductor memory in the first aspect of the present invention solves the problems previously described with reference to FIG. 6, because the address gate of one of the two nonvolatile split gate memory cells arranged horizontally on the opposite sides of each bit line, respectively, is formed nearer to the same bit line than the memory gate electrode of the same nonvolatile split gate memory cell, and the memory gate electrode of the other nonvolatile split gate memory cell is formed at a position near to the same bit line than a position where the address gate electrode of the same nonvolatile split gate memory cell is formed. Since the nonvolatile split gate memory cells are thus arranged in an X-configuration, each memory cell is formed in a relatively small area and the semiconductor memory has a high degree of integration. If the nonvolatile split gate memory cells are designed on the basis of a design rule of 1.0 μm, an area required by each nonvolatile split gate memory cell is on the order of 13.3 μm2, which is about 23% smaller than the area required by the memory cell of the prior art semiconductor memory shown in FIGS. 5 and 6, and the degree of integration of the semiconductor memory in the first aspect of the present invention is approximately equal to that of a semiconductor memory comprising stacked gate memory cells designed on the basis of the same design rule. Thus, the disadvantage of the semiconductor memory comprising split gate memory cells that the degree of integration is lower than that of a semiconductor memory comprising stacked gate memory cells can be eliminated, making full use of the advantages of split gate memory cells.

Semiconductor memory in a second aspect of the present invention comprises: first bit lines; second bit lines; and first nonvolatile split gate memory cells and second nonvolatile split gate memory cells respectively having common source electrodes, memory gate electrodes connected to common memory gate lines, and drain electrodes connected, respectively, to the first bit lines and the second bit lines;

characterized in that a source voltage applying means applies a voltage VS different from a voltage applied to the substrate and meeting a relation expressed by:

$$min(VB1, VB2) < VS < max(VB1, VB2) \qquad (1)$$

where VB1 is a voltage applied the first bit line, VB2 is a voltage applied to the second bit line, min(VB1, VB2) is the lower one of the voltages VB1 and VB2, and max(VB1, VB2) is the higher one of the voltages VB1 and VB2, to the source electrode in writing data on the first nonvolatile split gate memory cell.

In the semiconductor memory in the second aspect of the present invention, the source electrodes and the substrate are isolated from each other to apply a voltage different from the voltage applied to the substrate to the source electrode and the voltage VS meeting the relation represented by the expression (1) is applied to the source electrode in writing data in the nonvolatile spit gate memory cell. Accordingly, a relatively low voltage is applied across the drain and the source for writing, so that the breakdown due to punch-through does not occur in the nonvolatile split gate memory cells. Thus, the size of the nonvolatile split gate memory cells can be further reduced to increase the degree of integration of the semiconductor memory.

A semiconductor memory according to the present invention may have the features of both the semiconductor memories in the first and second aspect of the present invention.

A semiconductor memory in a third aspect of the present invention comprises:

a plurality of electrically erasable, nonvolatile split gate memory cells each having two source/drain electrodes, and an address gate electrode and a memory gate electrode for controlling the two source/drain electrodes; and a plurality of vertical, parallel bit lines; and a voltage applying means for applying a voltage VS different from a voltage applied to the substrate an meeting a relation represented by:

$$min(VB1, VB2) < VS < max(VB1, VB2) \qquad (1)$$

where VB1 is a voltage applied to a second bit line opposite a first bit line with respect to a first nonvolatile split gate memory cell, on the opposite sides of which are disposed the first nonvolatile split gate memory cell and a second .nonvolatile split gate memory cell, VB2 is a voltage applied to a third bit line opposite the first bit line with respect to the second nonvolatile split gate memory cell, min(VB1, VB2) is the lower one of the voltages VB1 and VB2, and max(VB1, VB2) is the higher one of the voltages VB1 and VB2, to the first bit line in writing data on the first nonvolatile split gate memory cell; wherein (a) the nonvolatile split gate memory cells are disposed between the adjacent bit lines, one of the two source/drain electrodes of each of the adjacent nonvolatile split gate memory cells on the opposite sides of each bit line is connected to a predetermined point on the same bit line so as to form a plurality of parallel first memory cell lines extending in parallel to a line extending in a first diagonal direction, (b) one of the two source/drain electrodes of each of the adjacent nonvolatile split gate memory cells on the opposite sides of each bit line is connected to a predetermined point on the same bit line so as to form a plurality of parallel second memory cell lines extending in parallel to a line extending in a second diagonal direction, (c) the address gate electrode of one of the two nonvolatile split gate memory cells arranged horizontally on the opposite sides of each bit line, respectively, is nearer to the same bit line than the memory gate electrode of the same nonvolatile split gate memory cell, and the memory gate of the other nonvolatile split gate memory cell is nearer to the same bit line than the address gate electrode of the same nonvolatile split gate memory cell.

Since the semiconductor memory in the third aspect of the present invention has the features of both the semiconductor memories in the first and second aspect of the present invention, the area occupied by each nonvolatile split gate memory cell is reduced by 23%, the nonvolatile split gate memories can be miniaturized, and the degree of integration of the semiconductor memory can be increased even if the semiconductor memory is designed on the same design rule.

A semiconductor memory in a fourth aspect of the present invention comprises:

a plurality of nonvolatile split gate memory cells divided into a plurality of erase blocks, the nonvolatile split gate memory cells of each erase block being subjected simultaneously to erasing;

dummy cells provided respectively in connection with the erase blocks, each dummy cell being subjected to erasing or writing together with the nonvolatile split gate memory cells of the corresponding erase block;

a selecting means for selecting one of the plurality of nonvolatile split gate memory cells and the dummy cell belonging to the erase block including the selected nonvolatile split gate memory cell; and a differential sense amplifier having one input terminal to which the output of the nonvolatile split gate memory cell selected by the selecting means is applied and the other input terminal to which the output of the dummy cell belonging to the erase block including the selected nonvolatile split gate memory cell is applied.

Each dummy cell may be included in the corresponding erase block or may be separate from the corresponding erase block, provided that the dummy cell is subjected to erasing or writing together with the nonvolatile split gate memory cells of the corresponding erase block.

In the semiconductor memory in the fourth aspect of the present invention, the dummy cells are provided respectively in connection with the erase locks of the nonvolatile split gate memory cells, and the dummy cells are subjected to erasing or writing together with the nonvolatile split gate memory cells of the corresponding erase blocks. Accordingly, the history of each dummy cell is the same as that of the nonvolatile split gate memory cells of the corresponding erase block, and the threshold voltage of the dummy cell changes with time in a mode similar to that of the time-dependent change of the threshold voltage of the nonvolatile split gate memory cells of the corresponding erase block. The respective outputs of the nonvolatile split gate memory cell and the dummy cell of the erase block including the same memory cell are applied to the differential sense amplifier in reading the contents of the nonvolatile split gate memory cell to compensate the time-dependent change of the threshold voltage for correct reading. Accordingly, the life of the nonvolatile split gate memory cell is increased to 107 sec or above when rewriting cycle is repeated 107 times, which is far longer than the life of 106 sec of the prior art memory cell.

A semiconductor memory according to the present invention may have the features of the semiconductor memories in the first, second and fourth aspects of the present invention.

A semiconductor memory in a fifth aspect of the present invention comprises:

a plurality of electrically erasable, nonvolatile split gate memory cells each having two source/drain electrodes, and an address gate electrode and a memory gate electrode for controlling the two source/drain electrodes, and divided into a plurality of erase blocks, the nonvolatile split gate memory cells of each of which being erased simultaneously;

a plurality of vertical, parallel bit lines;

a voltage applying means applies a voltage VS different from a voltage applied to the substrate and meeting a relation represented by:

$$min(VB1, VB2) < VS < max(VB1, VB2) \qquad (1)$$

where VB1 is a voltage applied to a second bit line opposite a first bit line with respect to a first nonvolatile split gate memory cell on the opposite sides of which are disposed the first nonvolatile split gate memory cell and a second nonvolatile split gate memory cell, VB2 is a voltage applied to a third bit line opposite the first bit line with respect to the second nonvolatile split gate memory cell, min(VB1, VB2) is the lower one of the voltages VB1 and VB2, and max(VB1, VB2) is the higher one of the voltages VB1 and VB2 to the first bit line in writing data on the first nonvolatile split gate memory cell;

dummy cells provided respectively in connection with the erase blocks, each dummy cell being subjected to erasing or writing together with the nonvolatile split gate memory cells of the corresponding erase block;

a selecting means for selecting one of the plurality of nonvolatile split gate memory cells and the dummy cell belonging to the erase block including the selected nonvolatile split gate memory cell; and a differential sense amplifier receives the output of the nonvolatile split gate memory cell selected by the selecting means at one input terminal thereof, and receives the output of the dummy cell belonging to the erase block including the selected nonvolatile split gate memory cell at the other input terminal thereof; wherein (a) the nonvolatile split gate memory cells are disposed between the adjacent bit lines, one of the two source/drain electrodes of each of the adjacent nonvolatile split gate memory cells on the opposite sides of each bit line is connected to a predetermined point on the same bit line so as to form a plurality of parallel first memory cell lines extending in parallel to a line extending in a first diagonal direction, (b) one of the two source/drain electrodes of each of the adjacent nonvolatile split gate memory cells on the opposite sides of each bit line is connected to a predetermined point on the same bit line so as to form a plurality of parallel second memory cell lines extending in parallel to a line extending in a second diagonal direction, and (c) the address gate electrode of one of the two nonvolatile split gate memory cells arranged horizontally on the opposite sides of each bit line, respectively, is nearer to the same bit line than the memory gate electrode of the same nonvolatile split gate memory cell, and the memory gate electrode of the other nonvolatile split gate memory cell is nearer to the same bit line than the address gate electrode of the same nonvolatile split gate memory cell.

Since the semiconductor memory in the fifth aspect of the present invention has the foregoing features, the nonvolatile split gate memory cells are arranged properly, punch-through can be prevented and the semiconductor memory has a high degree of integration. The dummy cells further extends the life of the semiconductor memory.

As is apparent from the foregoing description, in the semiconductor memories in the first, third and Fifth aspects of the present invention, the address gate electrode of one of the two nonvolatile split gate memory cells arranged horizontally on the opposite sides of each bit line, respectively, is formed at a position nearer to the same bit line than the position where the memory gate electrode of the same nonvolatile split gate memory cell is formed, and the memory gate electrode of the other nonvolatile split gate memory cell is formed at a position nearer to the same bit line than the position where the address gate electrode of the same nonvolatile split gate memory cell is formed. Since the nonvolatile split gate memory cells are thus arranged in an X-configuration, each memory cell is formed in a relatively small area and the semiconductor memory has a high degree of integration approximately equal to that of a semiconductor memory of an equivalent capacity comprising stacked gate memory cells, and it is possible to use the advantages of split gate memory cells further effectively.

In the semiconductor memories in the second, third and fifth aspects of the present invention, the source electrodes and the substrate are isolated from each other to apply a voltage different from the voltage applied to the substrate to the source electrodes and the voltage VS meeting the relation represented by the expression (1) is applied to the source electrode in writing data in the nonvolatile split gate memory cell. Accordingly, the normal write operation can be carried out, breakdown due to punch-through can be prevented and the further miniaturization of the nonvolatile split gate memory cell is possible.

In the semiconductor memories in the fourth and fifth aspects of the present invention, the dummy cell is subjected to erasing together with the memory cells of the erase block to which the dummy cell belongs, and the respective outputs of the memory cell and the dummy cell belonging to the erase block including the memory cell and having the same history as that of the memory cell are applied to the differential sense amplifier to read the contents of the memory cell. Accordingly, the time-dependent change of the threshold voltage can be compensated to extend the life of the semiconductor memory greatly,

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
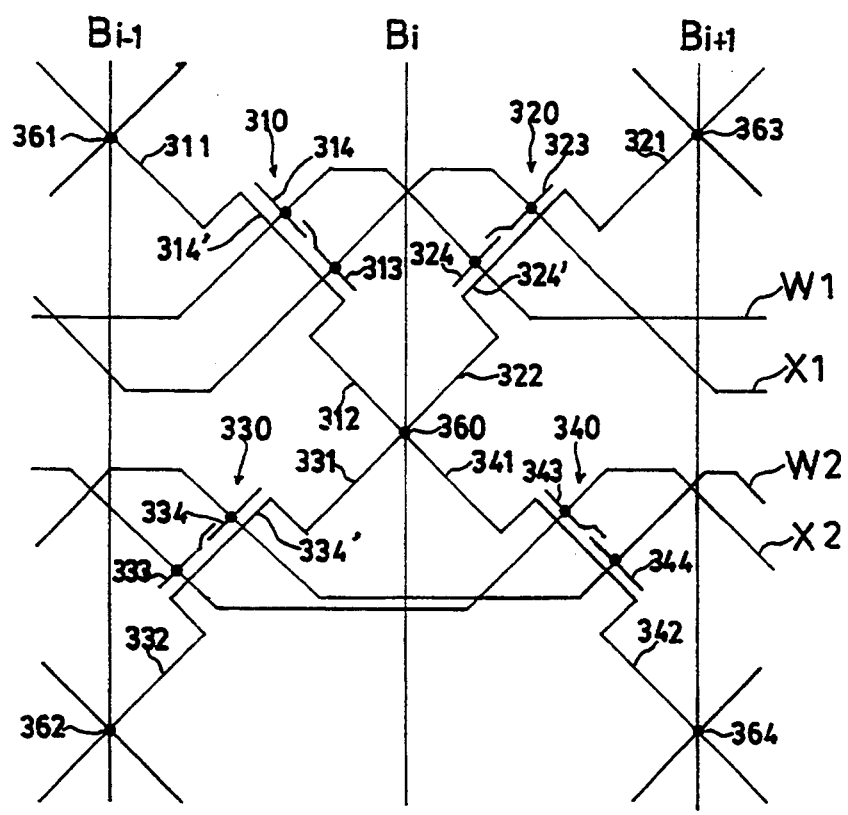
FIG. 1 is a circuit diagram of a portion of a semiconductor memory in a first embodiment according to the present invention.

A semiconductor memory in a first embodiment according to the present invention will be described hereinafter with reference to FIGS. 1 and 2, in which like or corresponding parts are denoted by the same reference characters.

Figure 2:
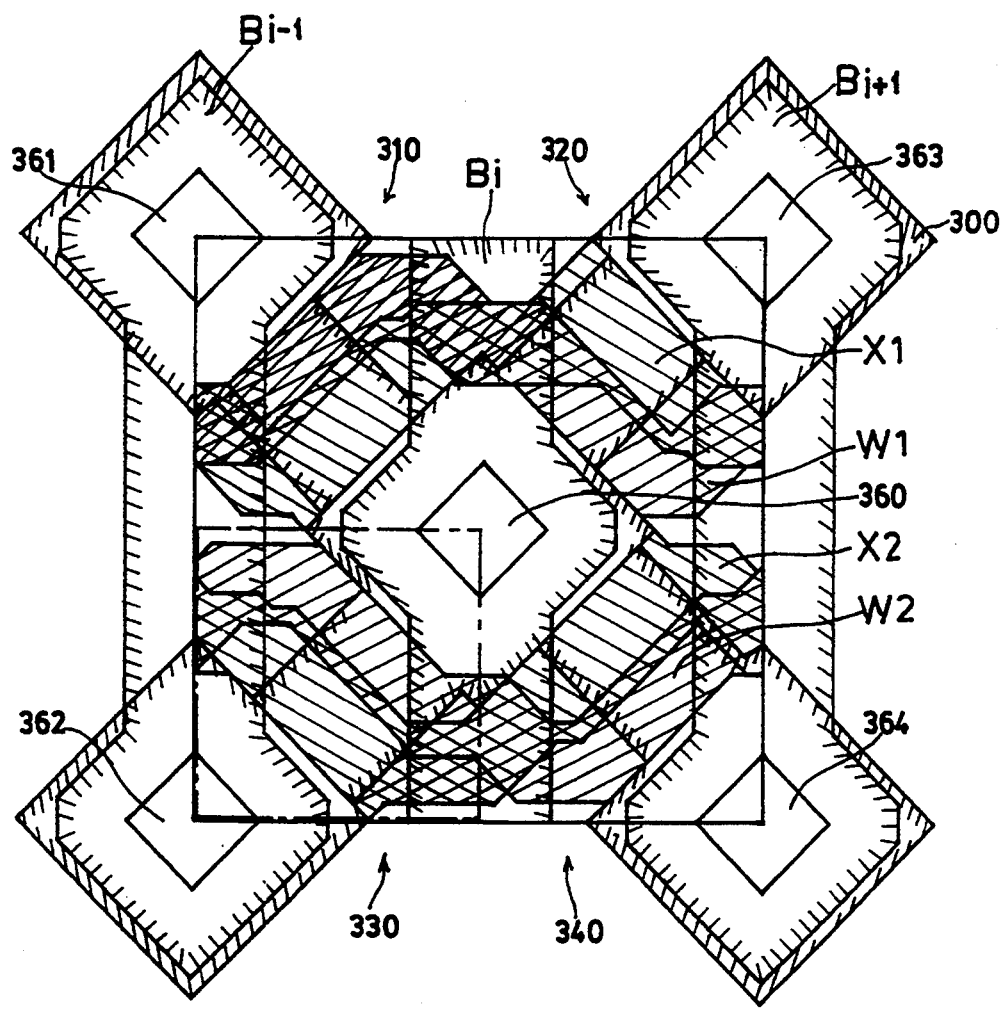
FIG. 2 is a plan view, corresponding to FIG. 1 showing the layout of components of the semiconductor memory on a semiconductor chip.

Referring to FIG. 2, four memory cells 310, 320, 330 and 340 are arranged in a transistor layout area 300 so that the memory cells 310 and 340 form a first memory cell line extending in a first diagonal direction, and the memory cells 320 and 330 form a second memory cell line extending in a second diagonal direction. In FIG. 2, three bit lines Bi−1, Bi and Bi+1 among a plurality of bit lines are shown.

As shown in FIG. 1, the memory cells 310, 320, 330 and 340 have two source/drain electrodes 311 and 312, two source/drain electrodes 321 and 322, two source/drain electrodes 331 and 332, and two source/drain electrodes 341 and 342, respectively. The respective source/drain electrodes 312, 322, 331 and 341 are connected to a predetermined point 360 on the bit line Bi, the respective other source/drain electrodes 311 and 332 of the memory cells 310 and 330 are connected to predetermined points 361 and 362 on the bit line Bi−1, respectively, and the respective other source/drain electrodes 321 and 242 of the memory cells 320 and 340 are connected to predetermined points 363 and 364 on the bit line Bi+1, respectively.

The address gate electrode 313 of the memory cell 310 is nearer to the bit line Bi than the memory gate electrode 314 of the same memory cell 310, the address gate electrode 323 of the memory cell 320 is nearer to the bit line Bi+1 than the memory gate electrode 324 of the same memory cell 320. Accordingly, an address gate line X1 connected to the address gate electrodes 313 and 323, and a memory gate line W1 connected to the memory gate electrodes 314 and 324 intersect each other. Similarly, the address gate electrode 333 of the memory cell 330 is nearer to the bit line Bi−1 than the memory gate electrode 334 of the same memory cell 330, and the address gate electrode 343 of the memory cell 340 is nearer to the bit line Bi than the memory gate electrode 344 of the same memory cell 340. Accordingly, an address gate line X2 connected to the address gate electrodes 333 and 343, and a memory gate line W2 connected to the memory gate electrodes 334 and 344 intersect each other.

When writing data, for example, on the memory cell 20, voltages tabulated in Table 2 are applied to the lines.

TABLE 2

| Lines | $B_{i-1}$ | $B_i$ | $B_{i+1}$ | W1 | X1 | W2 | X2 | Substrate |
|---|---|---|---|---|---|---|---|---|
| Voltages | 9 | 0 | 9 | 9 | 0 | 0 | 0 | 0 |

A voltage of 9 V is applied to the memory gate electrode 324 of the memory cell 320 and a voltage of 0 V is applied to a layer 324' opposite the memory gate electrode 324 to write data in the memory cell 320. In this state, the memory cells 310, 330 and 340 are in the following conditions.

Memory Cell 310

A voltage of 9 V is applied to the memory gate 314. If the memory cell 310 has been previously written, the voltage of 0 V of the substrate is applied to the layer 314' facing the memory gate electrode 314 for writing the memory cell 310 again. If the memory cell 310 has been previously erased, a voltage of 9 V of the bit line Bi−1 is applied to the layer 314' for neither writing nor erasing.

Memory Cell 330

A voltage of 0 V is applied to the memory gate 334 and the respective voltages of the bit line Bi and the substrate are 0 V. Therefore, the layer 334' facing the memory gate electrode 334 is at 0 V regardless of the state of the memory cell 330 and the memory cell 330 is neither written nor erased.

Memory Cell 340

The memory gate electrode 344 is at 0 V. The voltage of 0 V of the substrate is applied to the layer 344' facing the memory gate electrode 344 if the memory cell 340 has been previously written and the memory cell 340 is neither written nor erased. A voltage of 9 V is applied to the layer 344' facing the memory gate electrode 344 if the memory cell 340 has been previously erased and the memory cell is erased again.

Thus, when writing one of the four memory cells 310, 320, 330 and 340, the respective states of the rest of the memory cells remain unchanged. Similarly, when erasing one of the four memory cells 310, 320, 330 and 340, the respective states of the rest of the memory cells remain unchanged.

Figure 3:
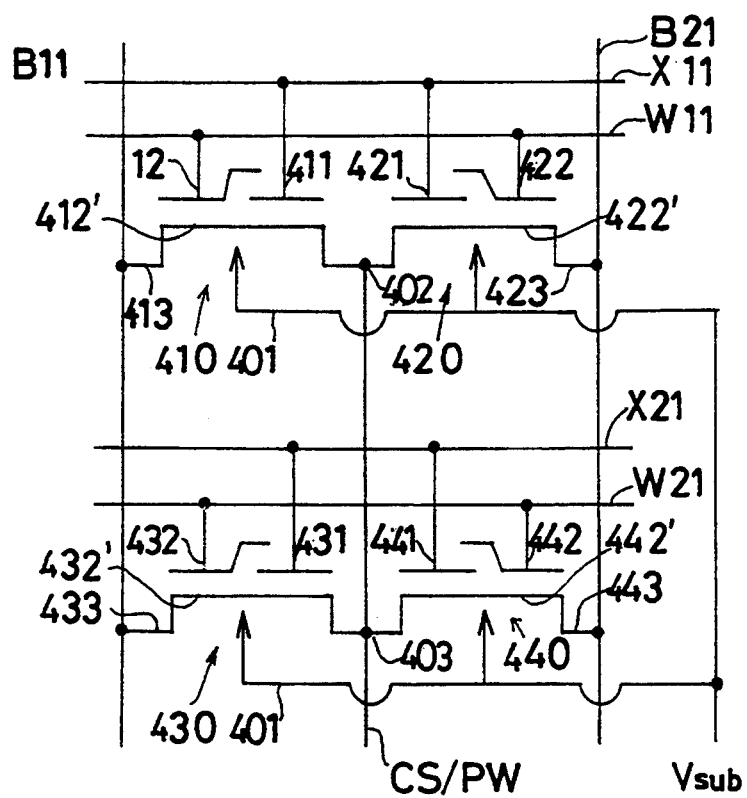
FIG. 3 is a circuit diagram of a portion of a semiconductor memory in a second embodiment according to the present invention.
Figure 10:
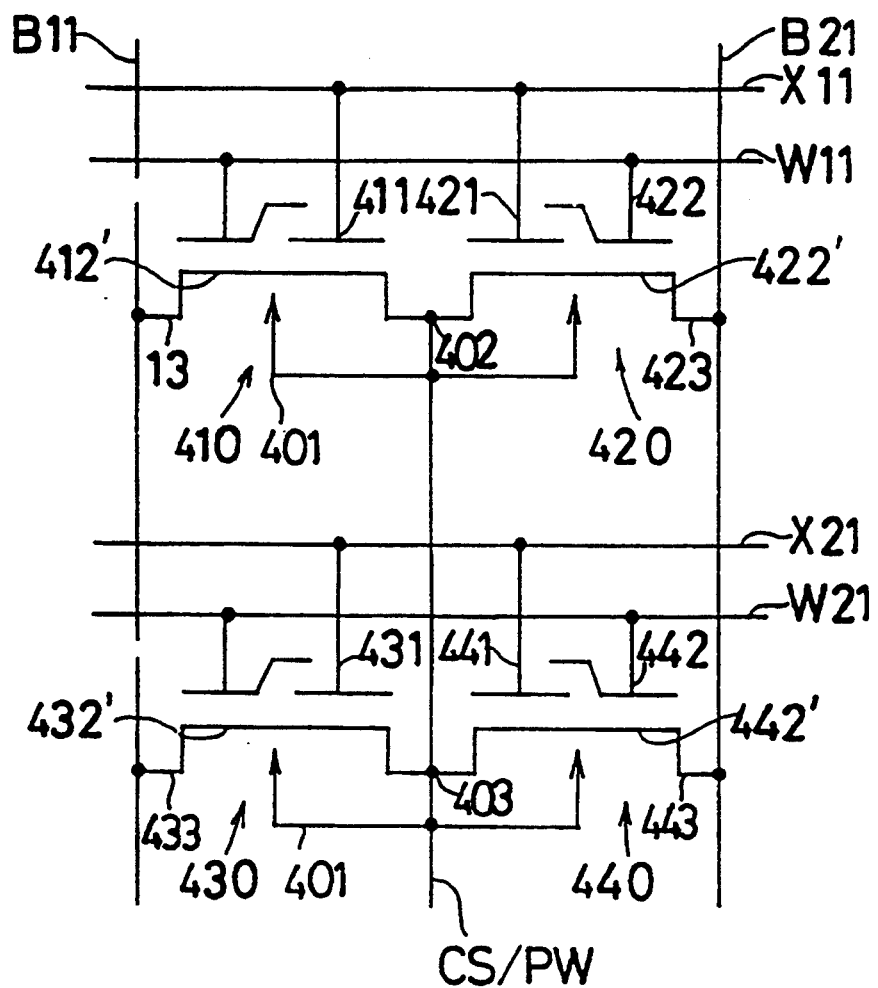
FIG. 10 is a circuit diagram of a portion of a prior art semiconductor memory comprising nonvolatile split gate memory cells.
Figure 11:
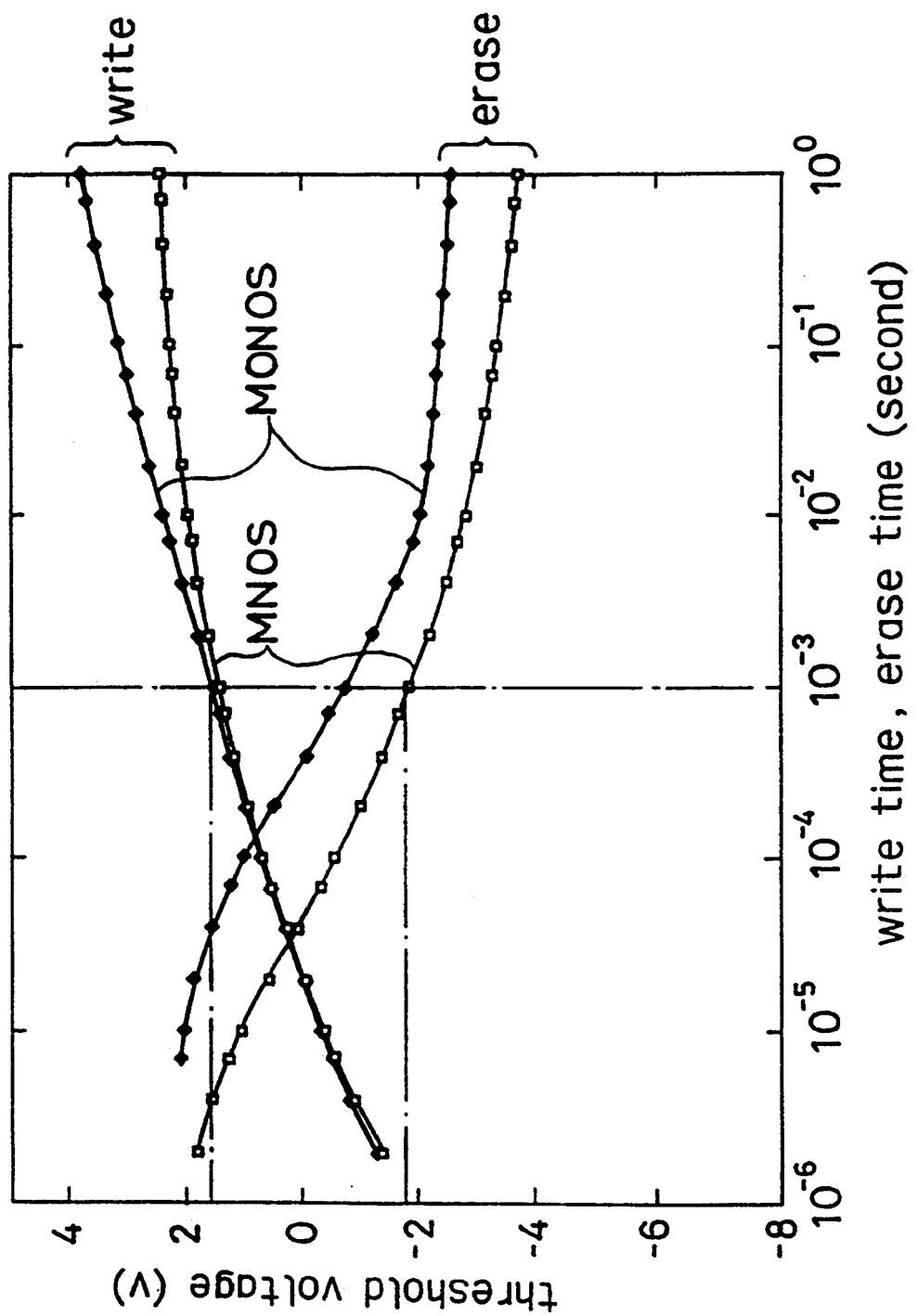
FIG. 11 is a graph showing the dependence of the respective threshold voltages of a MNOS memory cell and a MONOS memory cell on write time and erase time.
Figure 12:
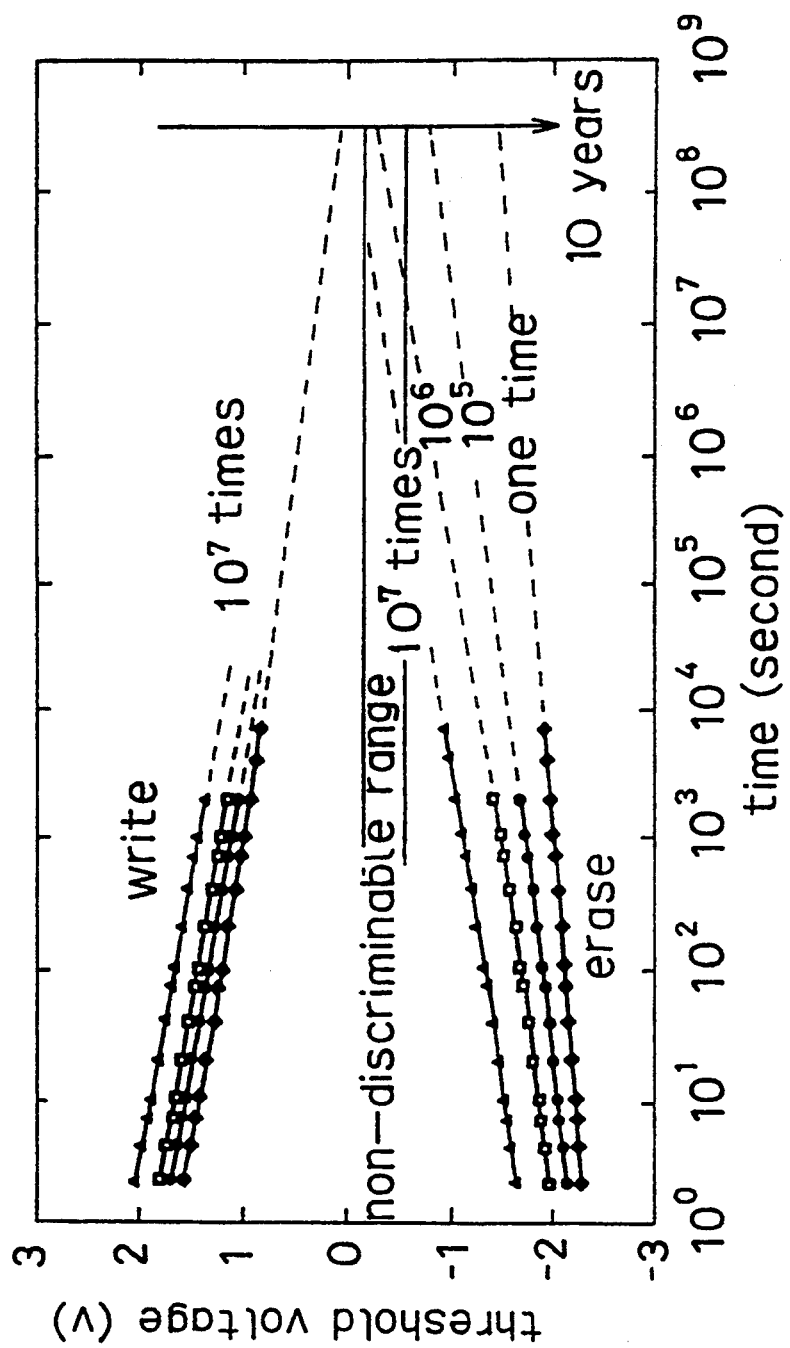
FIG. 12 is a graph showing the variation of the threshold voltage of a MNOS memory cell with time for the numbers of repetition of write cycle and erase cycle.

A semiconductor memory in a second embodiment according to the present invention is shown in FIG. 3, in which parts like or corresponding to those of the prior art semiconductor memory previously described with reference to FIG. 10 are denoted by the same reference characters and the description thereof will be omitted to avoid duplication.

Referring to FIG. 3, source electrodes 402 and 403 are connected to a line CS/PW, and a substrate 401 is not connected to the line CS/PW. Therefore, it is possible to apply a voltage different from a voltage VSUB to be applied to the substrate 401 to the source electrodes 402 and 403. When writing, erasing or reading a memory cell 410, voltages shown in Table 3 are applied to the components.

TABLE 3

|  | X1 | X2 | W1 | W2 | B1 | B2 | CS/PW | $V_{SUB}$ |
|---|---|---|---|---|---|---|---|---|
| Write mode | −4 | −4 | 5 | −4 | −4 | 5 | 0 | −4 |
| Erase mode | −4 | −4 | −4 | 5 | 5 | 5 | 5 | 5 |
| Read mode | 5 | 0 | 0 | 0 | Sens amp. | Open | 0 | 0 |

In the write mode, in which problems arises in the prior art semiconductor memory, the memory gate line W11 is at 5 V, the bit line B11 is at −4 V and the substrate 401 is at VSUB=−4 V to write the memory cell 410. A voltage of −4 V is applied to a layer 422' facing the memory gate electrode 422 of a memory cell 420 to write the memory cell 420 again if the memory cell 420 has been previously written or 5 V is applied to the layer 422' neither to write or erase the memory cell 420 if the memory cell 420 has been previously erased. Since the source electrode 402 is at 0 V in this state, the voltage across the layer 422' and the source electrode 402 is 4 V or 5 V, which is far lower than 9 V to be used in the prior art semiconductor memory. Therefore, punch-through does not occur even if the memory cells are further miniaturized.

Similarly, memory cells 430 and 440 operate normally and the potential difference between the source electrode 403 and the drain electrodes, i.e., layers 432' and 442', is relatively small.

Since a voltage of −4 V is applied to the substrate 401 for normal write operation and a voltage of 0 V between the voltages −4 V and 5 V applied respectively to the two bit lines B11 and B21 is applied to the source electrodes 402 and 403, the voltage across the source electrode 402 and the layers 412' and 422', and the voltage across the source electrode 403 and the layers 432' and 442' are relatively low. Consequently, the breakdown of the semiconductor memory due to punch-through can be obviated to eliminate one of the barriers to the miniaturization of the semiconductor memory.

A semiconductor memory in a third embodiment according to the present invention has the construction shown in FIGS. 1 and 2, has bit line not connected to the substrate, and provided with a voltage applying means that applies a voltage VS meeting a relation represented by the expression (1) to the respective source electrod. Since the construction and features of the semiconductor memory in the third embodiment are obvious from FIGS. 1 to 3 and the description made with reference to FIGS. 1 to 3, the illustration and description thereof will be omitted.

A semiconductor memory in a fourth embodiment according to the present invention will be described hereinafter with reference to FIG. 4, in which only essential portions of the semiconductor memory are shown and known circuits, such as a erase circuit, a write circuit, a boosting circuit and the like, incorporated into the semiconductor memory are omitted. The description of those known circuits will be omitted.

Referring to FIG. 2, the semiconductor memory 510 has a plurality of erase blocks 511-1, 511-2, ... and 511-n respectively having a plurality of memory cells 512-1-1, 512-1-2, . . . and 512-1-m and a dummy cell 513-1, . . . and a plurality of memory cells 512-n-1, 512-n-2, . . . and 512-n-m and a dummy cell 513-n. The memory cells of each erase block are subjected simultaneously to erasing or writing.

The memory cells and the dummy cell of each erase block are erased or written simultaneously; for example, the memory cells 512-1-1, 512-1-2, . . . and 512-1-m and the dummy cell 513-1 of the erase block 511-1 are erased or written simultaneously. The dummy cell 513-1 is set in the erase state, in which "1" is written on the dummy cell 513-1. Each of the memory cells or the dummy cell has a memory transistor a and a select transistor b. Control lines 516-10, 516-20, . . . and 516-n0, and word lines 516-1, 516-2, . . . and 516-n are gate control lines.

The function of the dummy cells and operation for reading data from the memory cells will be described hereinafter.

When reading the contents of the semiconductor memory, one of transistors 515-1, 515-2, . . . and 515-n forming a column selector 14 is turned on selectively, and a signal of "H" is applied to one of word lines 516-1, 516-2, . . . and 516-n to select only one memory cell at a time. In this state, all of control lines 516-10, 516-20, . . . and 516-n0 connected to the memory transistor a are "L". The output of the selected memory cell is applied through a bit line 517-1 to a current sense amplifier 518-1 and, at the same time, the output of the dummy cell of the erase block including the selected memory cell is applied through a bit line 517-2 to a current sense amplifier 518-2.

The memory cell 512-1-1 and the dummy cell 513-1 of the erase block 511-1 will be examined. Suppose that the memory cell 512-1-1 is in a erased state "1", a signal current I0 is supplied, and the dummy cell 513-1 is in the erased state. Then, I0>Ir, where Ir is a reference current. Generally, Ir - I0/2. Accordingly, differences in current sink strength are converted to proportional voltages by the current sense amplifiers 518-1 and 518-2, and the output voltage differences are applied to the differential sense amplifier 519.

Figure 5:
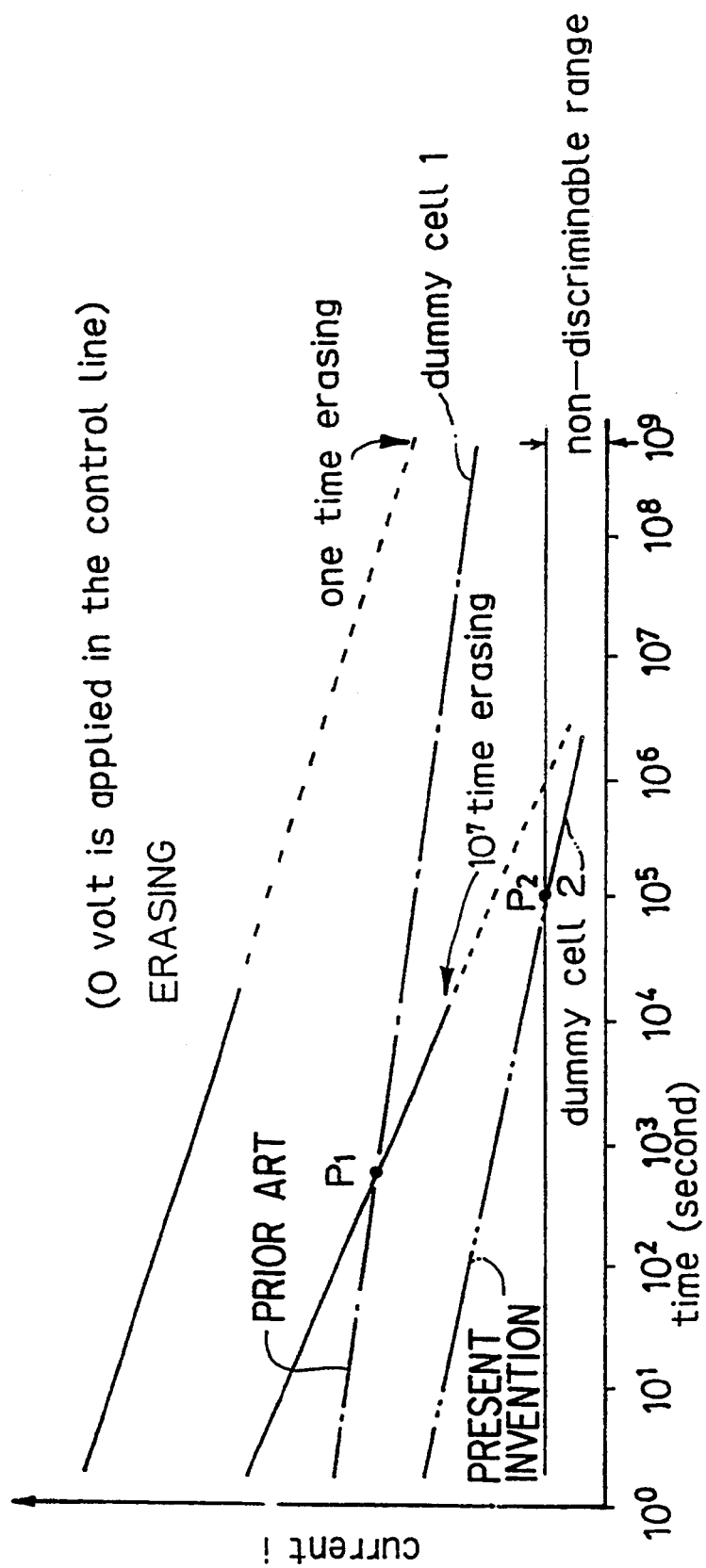
FIG. 5 is a graph showing the variation of current with time.
Figure 6:
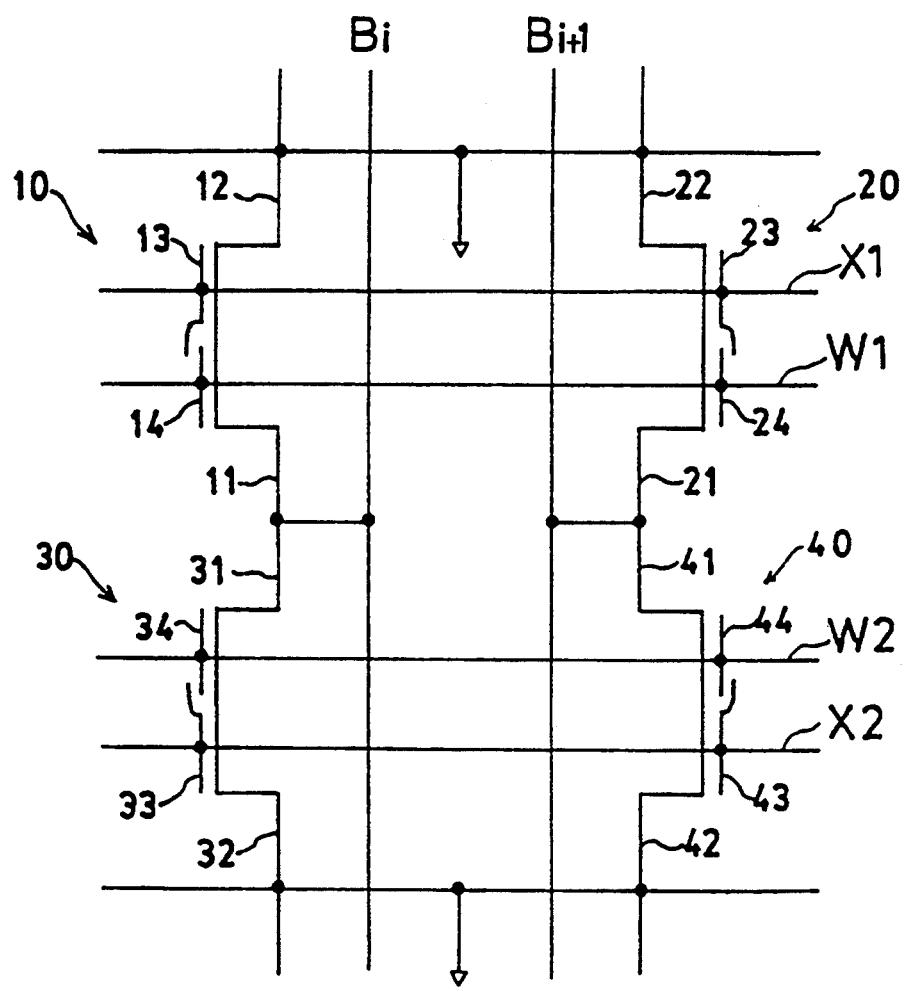
FIG. 6 is a circuit diagram of a portion of a semiconductor memory comprising nonvolatile split gate memory cells.
Figure 7:
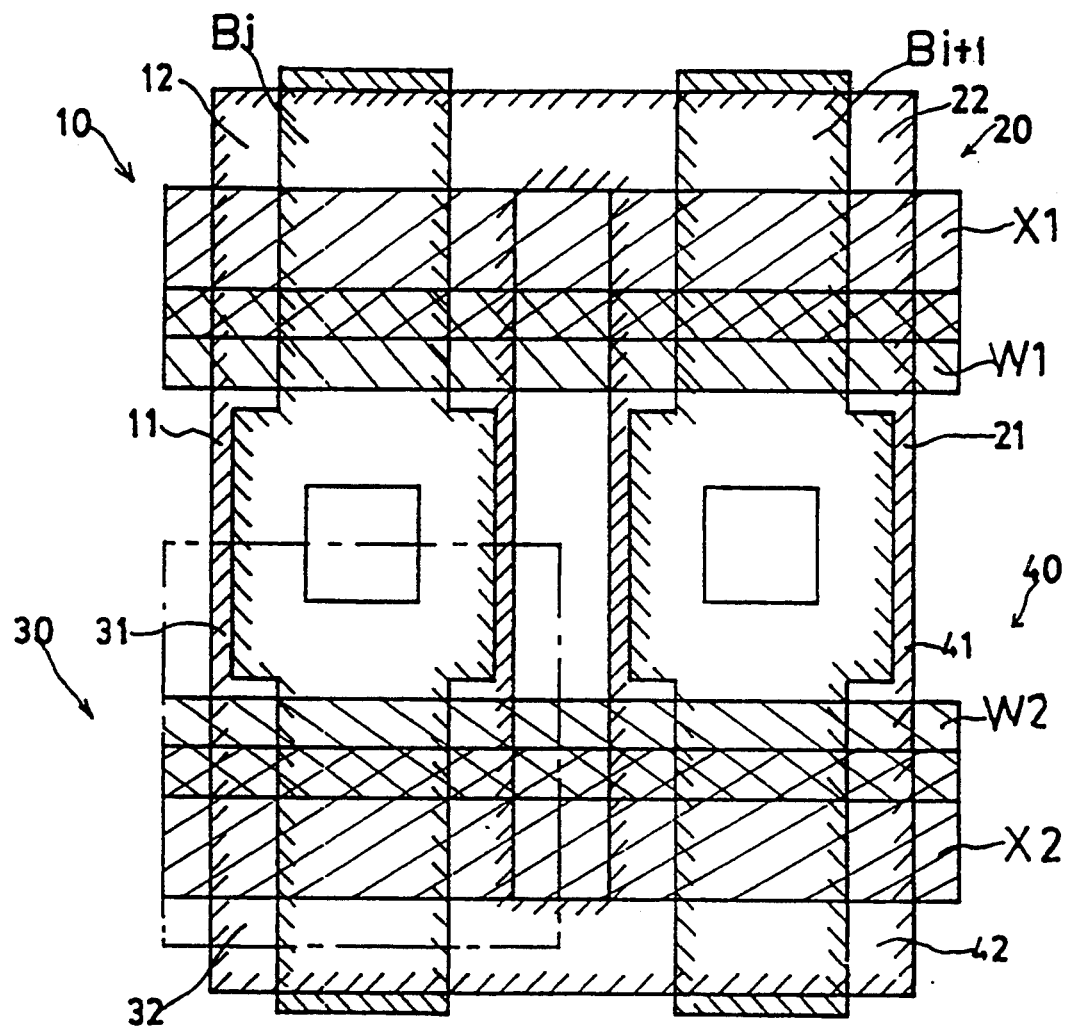
FIG. 7 is a plan view, corresponding to FIG. 6, showing the layout of the nonvolatile split gate memory cells on a semiconductor chip.
Figure 8:
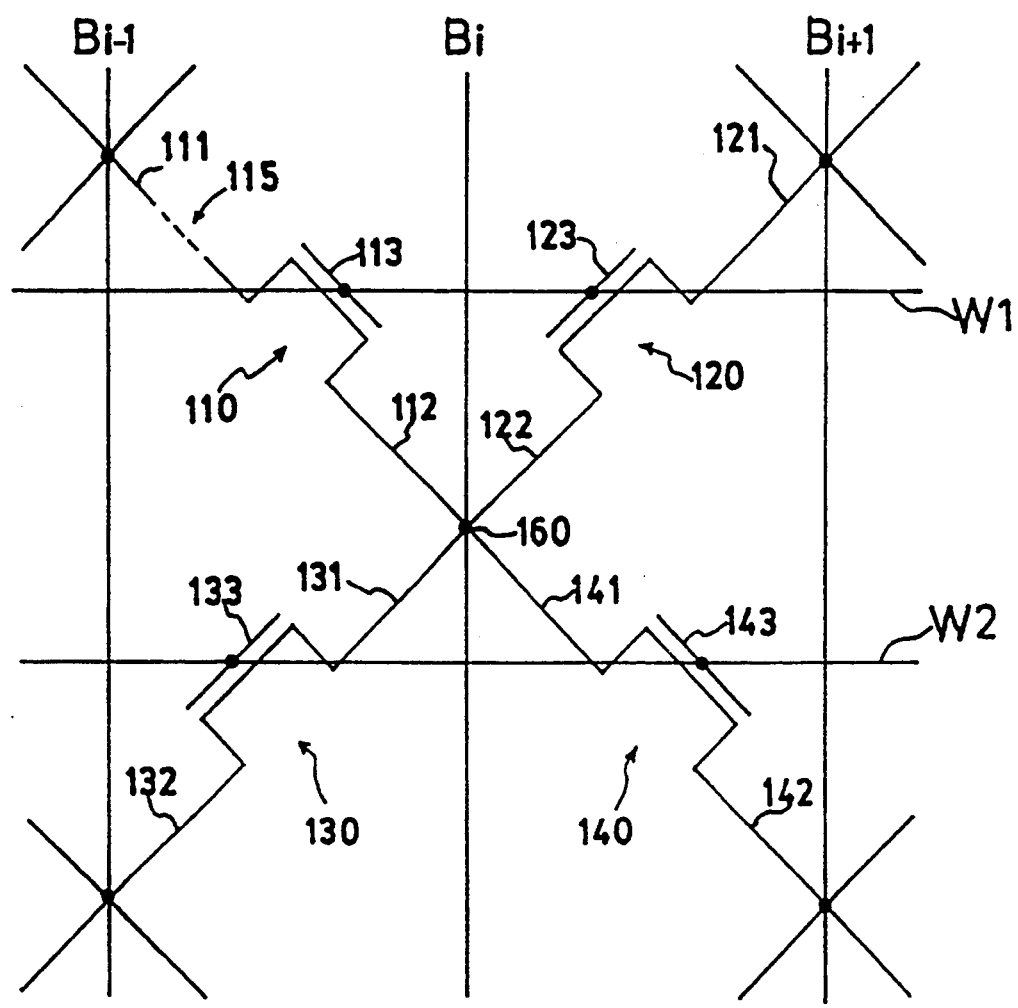
FIG. 8 is a circuit diagram of a portion of a ROM of an X-configuration.
Figure 9:
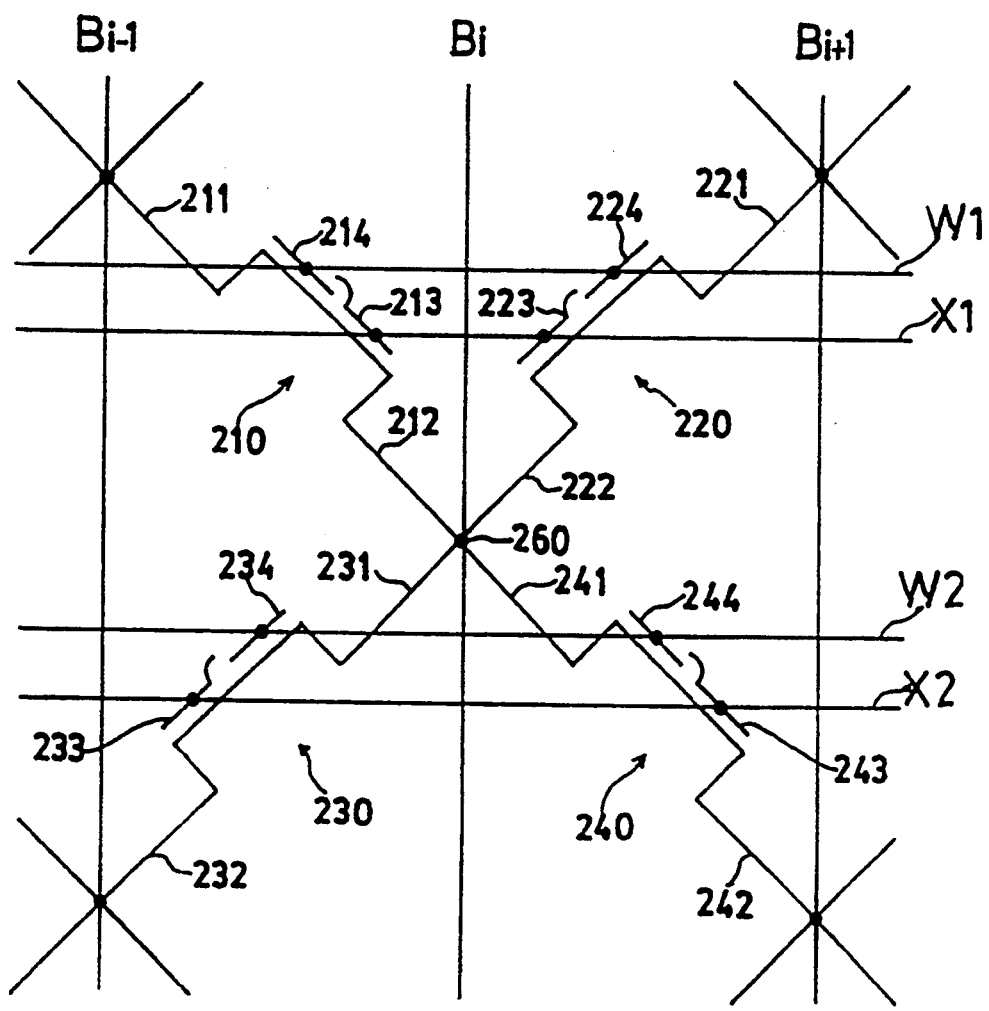
FIG. 9 is a circuit diagram of a portion of a semiconductor memory comprising split gate memory cells disposed in an X-configuration.

As mentioned above, the current changes with the number of rewrite cycles performed and data hold time as shown in FIG. 5. Data erasing case is very important for detecting data therefore, the explanation about the case will be described hereinafter.

In FIG. 5, current is measured upward on the ve rtical axis and time (sec) is measured to the right on the horizontal axis. A dummy cell 1 has been subjected to one erasing cycle and is subjected to neither writing nor erasing thereafter. The reference current is half the signal current supplied to a memory cell which has been subjected to one erasing cycle (alternate long and short dash line). A dummy cell 2 is associated with each erase block and has been written by a number of writing cycles equal to the number of writing cycles by which the erase block has been written. Finally, the dummy cell 2 is in the erase state ("1"). Shown in FIG. 5 is a current that flows through the dummy cell of an erase block which has been rewritten 107 times. The reference current for the dummy cell is half the signal current for the memory cell.

The current-time curve for the dummy cell 1 subjected intersects the current-time curve for a memory cell which has been rewritten 107 times at a point P1. In a state around the point P1, data detection is impossible. With the dummy cell 2, data detection become impossible in a range around a point P2. The ratio of time for the point P2 to that for the point P1 is about 102. Thus, the dummy cell associated with the erase block and subjected to writing cycles together with the associated erase block improves the data detection time characteristic greatly. In this example, the reference current for the dummy ceil is half the signal current for the memory cell, and the current sense amplifiers 518-1 and 518-2 have the same characteristics. It is also possible to detect data by using a reference current for the dummy cell equal to the signal current for the memory cell, and using current sense amplifiers differing from each other in output characteristics as the current sense amplifiers 518-1 and 518-2. In the latter case, the point P2 will appear on a signal current curve for a memory cell rewritten 107 times, which further extends the read possible time.

The memory cells of each of the erase blocks 511-1, 511-2, . . . and 511-n are subjected simultaneously to erasing or writing, and, when reading the selected memory cell, the respective outputs of the selected memory cell and the dummy cell included in the erase block including the selected memory cell are applied respectively to the inputs of the differential sense amplifier 519. Accordingly, the time-dependent change of the threshold voltage of the memory cell is compensated and the semiconductor memory is able to operate correctly for a long time.

The dummy cell need not necessarily be included in the corresponding erase block, provided that the dummy cell can be erased simultaneously with the memory cells of the corresponding erase block. When the dummy cell is included in the erase block and, if the memory cell 512-1-1 is selected, the word line 516-1 goes "H" and the respective outputs of the memory cell 512-1-1 and the dummy cell 513-1 appear respectively on the bit lines 517-1 and 517-2. If a noise signal is superposed on the word line 516-1, the noise signal affects both the memory cell 512-1-1 and the dummy cell 513-1, so that the influence of the noise signal is cancelled by the differential sense amplifier 519 to enable highly accurate reading.

Figure 4:
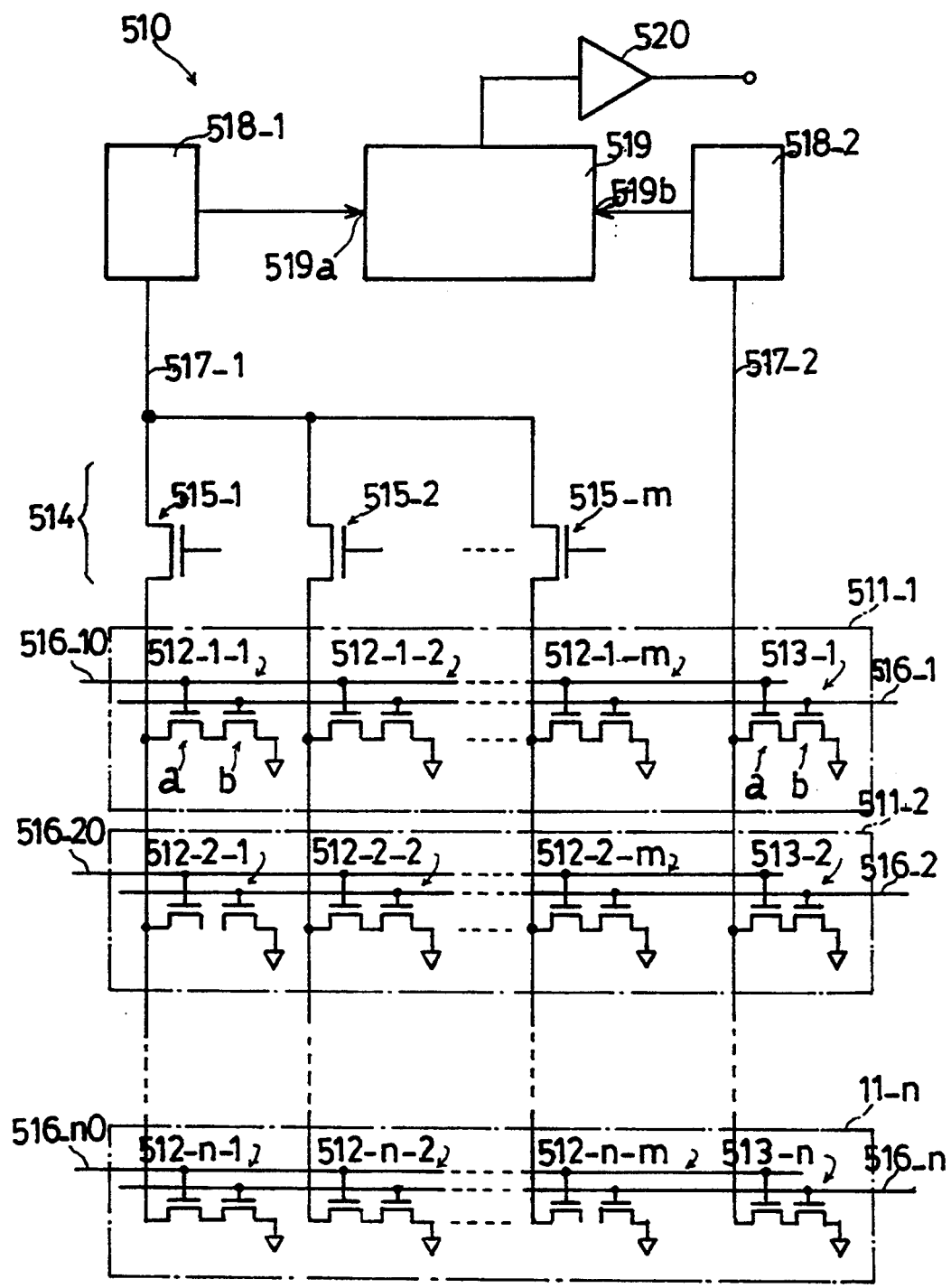
FIG. 4 is a circuit diagram of a portion of a semiconductor memory in a fourth embodiment according to the present invention.

A semiconductor memory in a fifth embodiment according to the present invention has the plurality of memory cells 512-1-1, 512-2-2, . . . and 512-2-m, ... and 512-n-1, 512-2-2, ... and 512-n-m, divided into the erase blocks 511-1, 511-2, . . . and 511-n as shown in FIG. 4 and arranged as shown in FIGS. 1 and 2, bit lines not connected to the substrate, and a voltage applying means for applying the voltage VS meeting the expression (1) to the bit line. Since the construction and function of the semiconductor memory in the fifth embodiment are apparent from FIGS. 1 to 4 and the description made with reference to FIGS. 1 to 2, the illustration and description thereof will be omitted.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A semiconductor memory comprising:
first bit lines;
second bit lines; and
first nonvolatile split gate memory cells and second nonvolatile split gate memory cells respectively having common source electrodes, memory gate electrodes connected to the common memory gate lines, and drain electrodes connected, respectively, to the first bit lines and the second bit lines;

characterized by a source voltage applying means which applies a voltage VS different from the voltage applied to a substrate and meeting a relation represented by:

$$min(VB1, VB2) < VS < max(VB1, VB2)$$

where VB1 is a voltage applied to the first bit line, VB2 is a voltage applied to the second bit line, min(VB1, VB2) is the lower one of the voltages VB1 and VB2, and max(VB1, VB2) is the higher one of the voltages VB1 and VB2, to the source electrode in writing data on the first nonvolatile split gate memory cell.

* * * * *